(12) United States Patent
Liang et al.

(10) Patent No.: US 11,984,859 B2
(45) Date of Patent: May 14, 2024

(54) CHOPPER AMPLIFYING CIRCUIT EMPLOYING NEGATIVE IMPEDANCE COMPENSATION TECHNIQUE

(71) Applicant: SOUTH CHINA UNIVERSITY OF TECHNOLOGY, Guangdong (CN)

(72) Inventors: Zhiming Liang, Guangdong (CN); Bin Li, Guangdong (CN); Zhaohui Wu, Guangdong (CN)

(73) Assignee: SOUTH CHINA UNIVERSITY OF TECHNOLOGY, Guangdong (CN)

( * ) Notice: Subject to any disclaimer, the term of this patent is extended or adjusted under 35 U.S.C. 154(b) by 427 days.

(21) Appl. No.: 17/428,637

(22) PCT Filed: Mar. 25, 2019

(86) PCT No.: PCT/CN2019/079466
§ 371 (c)(1),
(2) Date: Aug. 5, 2021

(87) PCT Pub. No.: WO2020/177163
PCT Pub. Date: Sep. 10, 2020

(65) Prior Publication Data
US 2022/0115998 A1   Apr. 14, 2022

(30) Foreign Application Priority Data
Mar. 7, 2019   (CN) .......................... 201910170800.0

(51) Int. Cl.
*H03F 1/02*    (2006.01)
*H03F 3/387*   (2006.01)
*H03F 3/45*    (2006.01)

(52) U.S. Cl.
CPC .......... *H03F 3/387* (2013.01); *H03F 3/45475* (2013.01)

(58) Field of Classification Search
CPC ................. H03F 3/387; H03F 3/45475; H03F 2200/129; H03F 2200/271;
(Continued)

(56) References Cited

U.S. PATENT DOCUMENTS

2019/0158035 A1*   5/2019   Trifonov ................. H03F 3/387

FOREIGN PATENT DOCUMENTS

| CN | 101001079 | 7/2007 |
|----|-----------|--------|
| CN | 106452372 | 2/2017 |

(Continued)

OTHER PUBLICATIONS

"International Search Report (Form PCT/ISA/210) of PCT/CN2019/079466," dated May 28, 2019, with English translation thereof, pp. 1-4.

*Primary Examiner* — Khanh V Nguyen
(74) *Attorney, Agent, or Firm* — JCIP GLOBAL INC.

(57) ABSTRACT

A chopper amplifying circuit employing a negative impedance compensation technique, including a differential input end, a first-level chopper switch, a first-level amplifying circuit, a second-level chopper switch, a second-level amplifying circuit, a negative impedance converting circuit, a negative feedback unit, an input capacitor, and a differential output end, is provided. The differential input end is connected to the first-level chopper switch. An output terminal of the first-level chopper switch is connected to the first-level amplifying circuit through the input capacitor. The first-level amplifying circuit is connected to the second-level chopper switch, which is connected to the second-level amplifying circuit. The second-level amplifying circuit is connected to the differential output end, and is also connected to a feedback input end of the first-level amplifying circuit through the negative feedback unit. The negative (Continued)

impedance converting circuit is parallel-connected to a signal input end of the first-level amplifying circuit.

5 Claims, 7 Drawing Sheets

(58) Field of Classification Search
CPC ..... H03F 2200/369; H03F 2203/45068; H03F 2203/45074; H03F 2203/45076; H03F 2203/45082; H03F 2203/45084; H03F 3/393; H03F 3/45645; H03F 1/26; H03F 1/56; H03F 3/45188; H03F 1/02; H03F 1/303; H03F 3/005
USPC .......................................................... 330/9
See application file for complete search history.

(56) References Cited

FOREIGN PATENT DOCUMENTS

| | | |
|---|---|---|
| CN | 107137074 | 9/2017 |
| CN | 107294501 | 10/2017 |
| CN | 108336974 | 7/2018 |

\* cited by examiner

CHOPPER AMPLIFYING CIRCUIT EMPLOYING NEGATIVE IMPEDANCE COMPENSATION TECHNIQUE

CROSS-REFERENCE TO RELATED APPLICATION

This application is a 371 of international application of PCT application serial no. PCT/CN2019/079466, filed on Mar. 25, 2019, which claims the priority benefits of China application no. 201910170800.0, filed on Mar. 7, 2019. The entirety of each of the above-mentioned patent applications is hereby incorporated by reference herein and made a part of this specification.

BACKGROUND

Technical Field

The disclosure relates to the technical field of analog circuit design, and in particular to a chopper amplifying circuit employing a negative impedance compensation technique.

Description of Related Art

Since the chopper amplifying technique was proposed in 1948, with the continuous development of the integrated circuit technique, the chopper amplifying technique was soon applied to the chip integration technique. The chopper amplifying technique is a modulation technique that improves the performance of an operational amplifier. The basic principle is to use an alternating current modulation signal to modulate low-frequency noise and offset voltage to high-frequency, and then eliminate the influence by filter processing. The chopper amplifying technique is mainly used for low-noise amplification of low-frequency weak signals.

Figure 1:
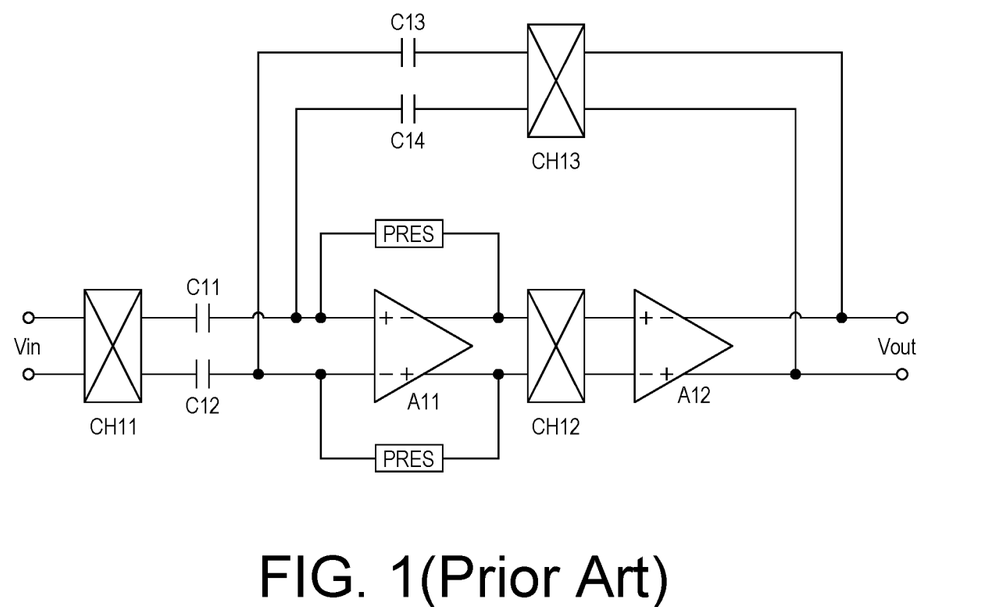
FIG. 1 is a schematic diagram of a circuit structure of a chopper amplifying circuit in the prior art.

The implementation of a typical chopper amplifier fully integrated circuit is usually as shown in FIG. 1. A differential voltage signal is modulated into a high-frequency alternating current signal via a chopper switch CH11. The high-frequency alternating current signal is coupled to a differential input end of a fully differential operational amplifier A11 by input capacitors C11 and C12. A signal amplified by the fully differential operational amplifier A11 is demodulated by a chopper switch CH12 to obtain an amplified initial differential voltage signal to be further amplified and output by an operational amplifier A12. An output voltage signal is remodulated by a chopper switch CH13, and is fed back to the differential input end of the fully differential operational amplifier A11 by capacitors C13 and C14 to form large loop negative feedback to stabilize the gain of the chopper amplifying circuit. In practical applications, let the capacitance values of the capacitors C11=C12 and C13=C14, ignoring the influence of parasitic parameters, the magnification of the chopper amplifying circuit may be calculated as Av=C11/C13.

The chopper amplifying circuit employs the fully differential operational amplifier as a first-level amplifier. Since forward and reverse input ends of the operational amplifier have "virtual short" characteristics during closed-loop working, an input impedance of the chopper amplifying circuit employing such structure is determined by the input capacitors C11 and C12. Assuming that the chopper frequency employed by the chopper amplifying circuit is fchop, the input impedance may be calculated as Zin=1/(2×fchop× C11). Also, since a capacitive reactance of a capacitor is inversely proportional to a capacitance value, and is also inversely proportional the frequency of an input signal thereof, the capacitive reactance of the input capacitor decreases as the frequency of the input signal increases. The chopper amplifying circuit shows a relatively low input impedance to a signal after chopper modulation. If an input capacitance is reduced to increase the input impedance, the parasitic parameters of the circuit will cause the precise control of the amplification of the chopper amplifying circuit to be affected, and the effect is not obvious.

Figure 2:
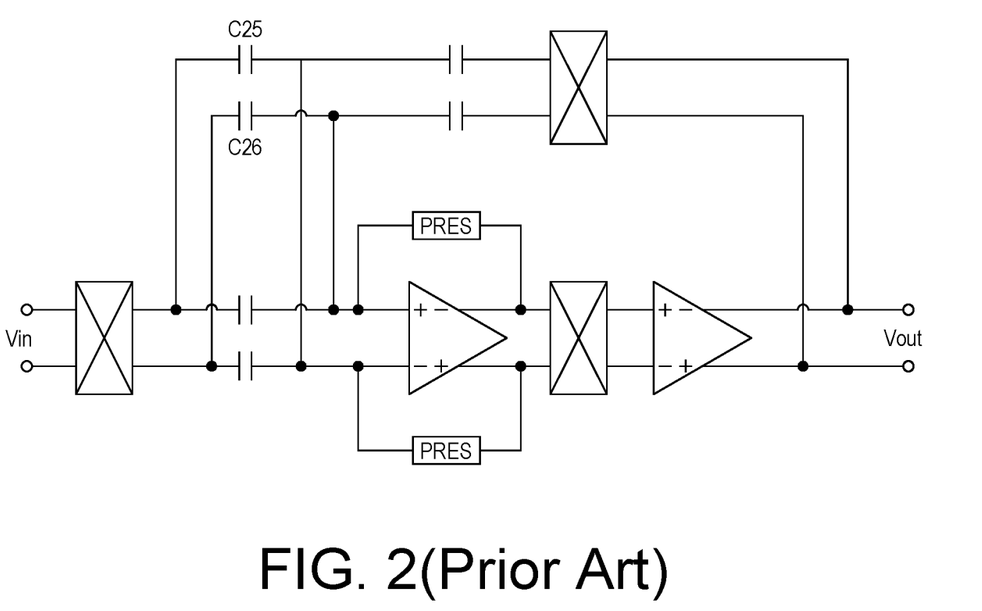
FIG. 2 is a schematic diagram of a circuit structure of a method for increasing an input impedance of the chopper amplifying circuit in the prior art.

Therefore, the chopper amplifying circuit in the prior art employs a positive feedback loop to increase the input impedance. Feedback capacitors C25 and C26 are added to form positive feedback on the basis of the typical chopper amplifying circuit to obtain a circuit structure shown in FIG. 2. However, by adopting such method, when an excessive amount of positive feedback is introduced, the stability of the circuit is affected, and it is difficult to increase the input impedance to a level above G Ω, which cannot meet some application scenarios that require extremely high input impedance. That is, the chopper amplifying circuit in the prior art cannot be applicable in some scenarios that require extremely high input impedance.

SUMMARY

In order to solve the issues in the prior art, the objective of the disclosure is to provide a chopper amplifying circuit employing a negative impedance compensation technique. The chopper amplifying circuit of the disclosure has extremely high input impedance while also having high stability. The disclosure can be applied to scenarios requiring extremely high input impedance.

The chopper amplifying circuit employing the negative impedance compensation technique of the disclosure includes a differential input end, a first-level chopper switch, a first-level amplifying circuit, a second-level chopper switch, a second-level amplifying circuit, a negative impedance converting circuit, a negative feedback unit, input capacitors, and a differential output end. Two ports of the differential input end are respectively connected to two input terminals of the first-level chopper switch for inputting a differential voltage signal. Two output terminals of the first-level chopper switch are respectively connected to two signal input ends of the first-level amplifying circuit through the input capacitors. Two signal output ends of the first-level amplifying circuit are respectively connected to two input terminals of the second-level chopper switch. Two output terminals of the second-level chopper switch are respectively connected to two signal input ends of the second-level amplifying circuit. Two signal output ends of the second-level amplifying circuit are respectively connected to two ports of the differential output end, and are also connected to a feedback input end of the first-level amplifying circuit through the negative feedback unit. The negative impedance converting circuit is parallel-connected to a signal input end of the first-level amplifying circuit for reducing an equivalent input capacitance of the first-level amplifying circuit.

Preferably, the negative impedance converting circuit includes a first port, a second port, a first capacitor, a second capacitor, a third capacitor, a fourth capacitor, a fifth capacitor, a first operational amplifier, a second operational amplifier, a first pseudo resistor, and a second pseudo resistor. An output end of the first operational amplifier is sequentially series-connected to the second capacitor, the third capacitor, and the fourth capacitor, and is then connected to an output end of the second operational amplifier. A non-inverting input end of the first operational amplifier is connected to the first port. An inverting input end is connected between the second capacitor and the third capacitor. An output end is connected to the non-inverting input end of the first operational amplifier through the first capacitor. The first pseudo resistor is parallel-connected to two ends of the second capacitor. A non-inverting input end of the second operational amplifier is connected to the second port. An inverting input end is connected between the third capacitor and the fourth capacitor. An output end is connected to the non-inverting input end of the second operational amplifier through the fifth capacitor. The second pseudo resistor is parallel-connected to two ends of the fourth capacitor. A capacitance value of the negative impedance converting circuit is set through setting capacitance values of the first capacitor, the second capacitor, the third capacitor, the fourth capacitor, and the fifth capacitor.

Preferably, the negative feedback unit includes a negative feedback unit chopper switch, a sixth capacitor, a seventh capacitor, and an eighth capacitor. Two signal output ends of the second-level amplifying circuit are respectively connected to two input terminals of the negative feedback unit chopper switch. One of output terminals of the negative feedback unit chopper switch is connected to the sixth capacitor. Other one of the output terminals is connected to the seventh capacitor. The eighth capacitor is connected to the sixth capacitor and the seventh capacitor.

Preferably, the first-level amplifying circuit includes a third operational amplifier, a third pseudo resistor, a fourth pseudo resistor, a fifth pseudo resistor, and a sixth pseudo resistor. The third operational amplifier includes a corresponding first non-inverting input end and first inverting input end, a corresponding second non-inverting input end and second inverting input end, and also includes a positive output end and a negative output end. One of the output terminals of the first-level chopper switch is connected to the first inverting input end through an input capacitor. Other one of the output terminals is connected to the second non-inverting input end through another input capacitor. The positive output end is connected to the first non-inverting input end after sequentially passing through the second-level chopper switch, the second-level amplifying circuit, and the negative feedback unit, and is also connected to the second inverting input end through the third pseudo resistor. The negative output end is connected to the second inverting input end after sequentially passing through the second-level chopper switch, the second-level amplifying circuit, and the negative feedback unit, and is also connected to the first non-inverting input end through the fourth pseudo resistor. After the fifth pseudo resistor and the sixth pseudo resistor are series-connected, two ends are respectively connected to the first inverting input end and the second non-inverting input end, and a common mode voltage input end is connected between the fifth pseudo resistor and the sixth pseudo resistor. Two ports of the negative impedance converting circuit are respectively connected to the first inverting input end and the second non-inverting input end.

Preferably, the first-level amplifying circuit includes a fourth operational amplifier, a fifth operational amplifier, a seventh pseudo resistor, an eighth pseudo resistor, a ninth pseudo resistor, and a tenth pseudo resistor. A non-inverting input end of the fourth operational amplifier is sequentially series-connected to the seventh pseudo resistor and the eighth pseudo resistor, and is then connected to an inverting input end of the fifth operational amplifier, and a common mode voltage input end is connected between the seventh pseudo resistor and the eighth pseudo resistor. An output end of the fourth operational amplifier is connected to a non-inverting input end of the fifth operational amplifier after sequentially passing through the second-level chopper switch, the second-level amplifying circuit, and the negative feedback unit, and is also connected to an inverting input end of the fourth operational amplifier through the ninth pseudo resistor. An output end of the fifth operational amplifier is connected to the inverting input end of the fourth operational amplifier after sequentially passing through the second-level chopper switch, the second-level amplifying circuit, and the negative feedback unit, and is also connected to the non-inverting input end of the fifth operational amplifier through the tenth pseudo resistor. One of the output terminals of the first-level chopper switch is connected to the non-inverting input end of the fourth operational amplifier through an input capacitor. Other one of the output terminals is connected to the inverting input end of the fifth operational amplifier through another input capacitor. Two ports of the negative impedance converting circuit are respectively connected to the non-inverting input end of the fourth operational amplifier and the inverting input end of the fifth operational amplifier.

The chopper amplifying circuit employing the negative impedance compensation technique according to the disclosure has the following advantages.

The negative impedance converting circuit can implement negative impedance conversion. The circuit is parallel-connected to the signal input end of the first-level amplifying circuit for compensating the input capacitance of the first-level amplifying circuit, so that an equivalent input capacitance value of the first-level amplifying circuit is reduced, thereby increasing the input impedance of the chopper amplifying circuit. The input impedance of the chopper amplifying circuit can be greatly improved through introducing the negative impedance converting circuit.

At the same time, different from the method of increasing the input impedance through introducing the positive feedback loop in the prior art, the disclosure does not need to introduce the positive feedback loop, which avoids the issue of introducing an excessive amount of positive feedback that affects the stability of the chopper amplifying circuit. The disclosure has high input impedance while having high stability. The disclosure can be applied to scenarios requiring extremely high input impedance, can be used for low-noise amplification of weak signals, and is especially suitable for low-noise amplification of weak signals with high input impedance.

Based on the advantages of high input impedance and high stability, the disclosure can be widely applied to the field of sensor signal amplification and acquisition, and especially applied to the field of fully integrated design of bioelectric signal acquisition systems such as electroencephalogram and electrocardiogram. The application prospects of the chopper amplifying technique in various fields are expanded.

DETAILED DESCRIPTION OF DISCLOSED EMBODIMENTS

Figure 3:
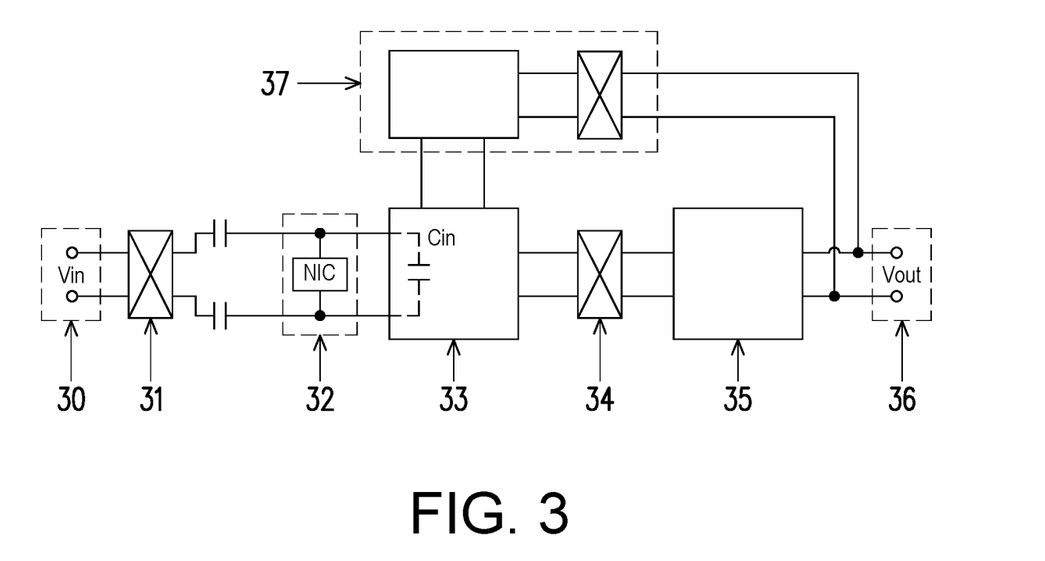
FIG. 3 is a schematic diagram of a circuit structure of a chopper amplifying circuit of the disclosure.

As shown in FIG. 3, a chopper amplifying circuit employing a negative impedance compensation technique according to the disclosure includes a differential input end 30, a first-level chopper switch 31, a negative impedance converting circuit 32, a first-level amplifying circuit 33, a second-level chopper switch 34, a second-level amplifying circuit 35, a differential output end 36, a negative feedback unit 37, and input capacitors. Two ports of the differential input end 30 are respectively connected to two input terminals of the first-level chopper switch 31 for inputting a differential voltage signal. Two output terminals of the first-level chopper switch 31 are respectively connected to two signal input ends of the first-level amplifying circuit 33 through the input capacitor. Two signal output ends of the first-level amplifying circuit 33 are respectively connected to two input terminals of the second-level chopper switch 34. Two output terminals of the second-level chopper switch 34 are respectively connected to two signal input ends of the second-level amplifying circuit 35. Two signal output ends of the second-level amplifying circuit 35 are respectively connected to two ports of the differential output end 36, and are also connected to a feedback input end of the first-level amplifying circuit 33 through the negative feedback unit 37. The negative impedance converting circuit 32 is parallel-connected to a signal input end of the first-level amplifying circuit 33 for reducing an equivalent input capacitance of the first-level amplifying circuit 33. The negative feedback unit 37, the first-level amplifying circuit 33, the second-level chopper switch 34, and the second-level amplifying circuit 35 jointly constitute a negative feedback loop. The gain of the chopper amplifying circuit is stabilized through negative feedback. There is no common connection point between the signal input end and the feedback input end of the first-level amplifying circuit 33, that is, there is no common connection point between a chopper input end and the negative feedback loop of the chopper amplifying circuit. Therefore, the first-level amplifying circuit 33 itself has a relatively high intrinsic input impedance. The input impedance of the chopper amplifying circuit is further increased after introducing the negative impedance converting circuit 32.

The differential input end 30 is used to input the differential voltage signal that needs to be amplified.

The first-level chopper switch 31 is used to modulate a frequency spectrum of the input differential voltage signal to an odd harmonic frequency of a chopping signal.

The first-level amplifying circuit 33 is used to amplify a signal output by the first-level chopper switch 31 while stabilizing the gain of the chopper amplifying circuit through connecting a feedback signal of the negative feedback unit 37.

The negative impedance converting circuit 32 is used to compensate an input capacitance of the signal input end of the first-level amplifying circuit 33 to reduce an equivalent input capacitance of the first-level amplifying circuit 33 and increase an input impedance of the chopper amplifying circuit.

The second-level chopper switch 34 is used to demodulate the signal amplified by the first-level amplifying circuit 33 to obtain an amplified initial differential signal while modulating noise and offset voltage generated by the first-level amplifying circuit 33 to the odd harmonic frequency of the chopping signal.

The second-level amplifying circuit 35 is used to amplify the initial differential signal demodulated by the second-level chopper switch 34.

A negative feedback unit chopper switch 371 is used to remodulate the amplified initial differential signal output by the second-level amplifying circuit 35 to the odd harmonic frequency of the chopping signal, and connect to the feedback input end in the first-level amplifying circuit 33 through a sixth capacitor C6, a seventh capacitor C7, and an eighth capacitor C8 to form negative feedback.

The sixth capacitor C6, the seventh capacitor C7, and the eighth capacitor C8 are used to perform voltage division on an output signal of the negative feedback unit chopper switch 371 with a certain proportional coefficient to be connected to the feedback input end of the first-level amplifying circuit 33 to form negative feedback and stabilize the gain of the chopper amplifying circuit.

The differential output end 36 is a final voltage signal output end of the chopper amplifying circuit.

The input capacitors are input coupling capacitors of the chopper amplifying circuit.

Figure 10:
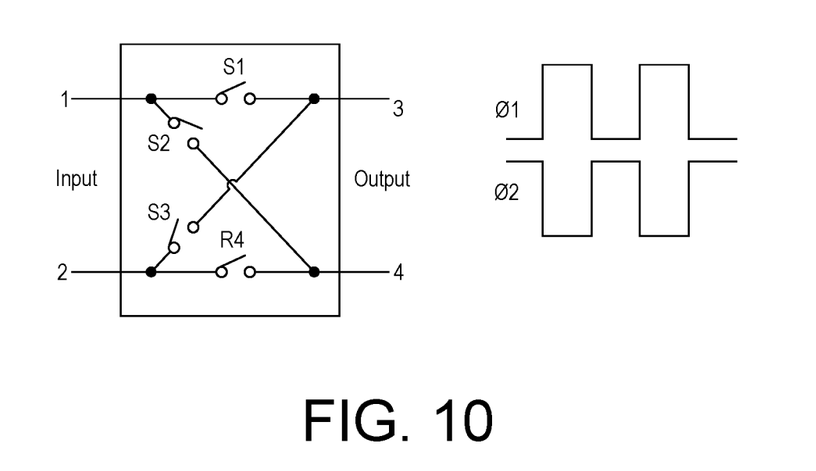
FIG. 10 is a circuit principle diagram and a signal diagram of a chopper switch in the disclosure.

The first-level chopper switch 31, the second-level chopper switch 34, and the negative feedback unit chopper switch 371 have the same function and structure, and are all chopper switches. The typical implementation principle is shown in FIG. 10. All have two input terminals, a port 1 and a port 2; and two output terminals, a port 3 and a port 4. The internal structure is composed of four switches S1, S2, S3, and S4 controlled by the chopping signal to be conducted and disconducted. The switches can be controlled to allow or prevent analog signals from passing through. The switch S1 bridges the port 1 and the port 3. The switch S2 bridges the port 1 and the port 4. The switch S3 bridges the port 2 and the port 3. The switch S4 bridges the port 2 and the port 4. The chopping signal is two square wave signals, a signal $\varphi1$ and a signal $\varphi2$, with 50% duty ratio and opposite phases. At a high level of the signal $\varphi1$, the switches S1 and S4 are conducted, and the switches S2 and S3 are disconducted. At a high level of the signal $\varphi2$, the switches S1 and S4 are disconducted, and the switches S2 and S3 are conducted.

The negative feedback unit 37 includes the negative feedback unit chopper switch 371, the sixth capacitor C6, the seventh capacitor C7, and the eighth capacitor C8. Two signal output ends of the second-level amplifying circuit 35 are respectively connected to two input terminals of the negative feedback unit chopper switch 371. One of the output terminals of the negative feedback unit chopper switch 371 is connected to the sixth capacitor C6. Other one of the output terminals is connected to the seventh capacitor C7. The eighth capacitor C8 is connected to the sixth capacitor C6 and the seventh capacitor C7.

Figure 4:
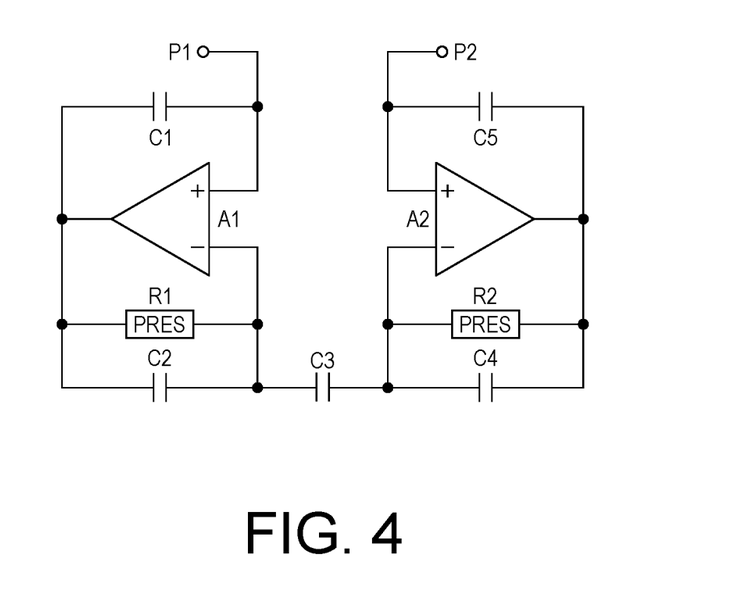
FIG. 4 is a schematic diagram of a circuit structure of a negative impedance converting circuit of the disclosure.

The negative impedance converting circuit 32 includes a first port P1, a second port P2, a first capacitor C1, a second capacitor C2, a third capacitor C3, a fourth capacitor C4, a fifth capacitor C5, a first operational amplifier A1, a second operational amplifier A2, a first pseudo resistor R1, and a second pseudo resistor R2. An output end of the first operational amplifier A1 is sequentially series-connected to the second capacitor C2, the third capacitor C3, and the fourth capacitor C4, and is then connected to an output end of the second operational amplifier A2. A non-inverting input end of the first operational amplifier A1 is connected to the first port P1. An inverting input end is connected between the second capacitor C2 and the third capacitor C3. An output end is connected to the non-inverting input end of the first operational amplifier A1 through the first capacitor C1. The first pseudo resistor R1 is parallel-connected to two ends of the second capacitor C2. A non-inverting input end of the second operational amplifier A2 is connected to the second port P2. An inverting input end is connected between the third capacitor C3 and the fourth capacitor C4. An output end is connected to the non-inverting input end of the second operational amplifier A2 through the fifth capacitor C5. The second pseudo resistor R2 is parallel-connected to two ends of the fourth capacitor C4. A capacitance value of the negative impedance converting circuit 32 is set through setting capacitance values of the first capacitor C1, the second capacitor C2, the third capacitor C3, the fourth capacitor C4, and the fifth capacitor C5.

The function of the negative impedance converting circuit 32 in the chopper amplifying circuit is equivalent to a negative capacitor. The circuit structure is parallel-connected to the input end of the first-level amplifying circuit 33 to reduce an equivalent input capacitance value of the first-level amplifying circuit 33, thereby increasing the input impedance of the chopper amplifying circuit. The implementation principle of the negative impedance converting circuit 32 is shown in FIG. 4. The circuit structure is as described above. The first pseudo resistor R1 and the second pseudo resistor R2 are direct current negative feedback resistors of the operational amplifier. The third capacitor C3 is a capacitor used for negative impedance conversion. The second capacitor C2 and the fourth capacitor C4 are negative feedback capacitors of the operational amplifier. The first capacitor C1 and the fifth capacitor C5 are positive feedback capacitors of the operational amplifier. When performing circuit implementation, generally, let the capacitance values of the capacitors C2=C4 and C1=C5. An implemented negative capacitance value may be calculated as follows:

$$Cn = -\frac{C1}{C2} \times C3$$

Assuming that an equivalent differential input capacitance of the first-level amplifying circuit 33 is Cin and a chopper switching frequency is fchop, an equivalent differential input impedance Zin of a chopper amplifier may be calculated as:

$$Zin = \frac{1}{2 \times fchop \times (2 \times Cin + 2 \times Cn)} = \frac{1}{4 \times fchop \times \left(Cin - \frac{C1}{C2} \times C3\right)}$$

Circuit parameters are reasonably designed, so that the product term $$\left(Cin - \frac{C1}{C2} \times C3\right)$$

in the denominator of the above equation is far less than Cin, which may greatly increase the equivalent input impedance of the chopper amplifying circuit. The most ideal situation is $$Cin - \frac{C1}{C2} \times C3 = 0,$$

that is, $$Cin = \frac{C1}{C2} \times C3.$$

Through introducing the negative impedance converting circuit 32, the equivalent input capacitance Cin of the first-level amplifying circuit 33 can be effectively reduced.

Figure 8:
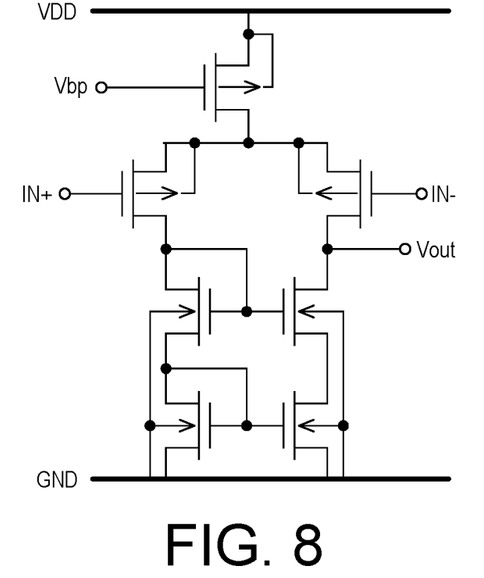
FIG. 8 is a circuit principle diagram of an operational amplifier employed in Embodiment 2 of a negative impedance converting circuit and a first-level amplifying circuit in the disclosure.

The typical implementation circuit of the first operational amplifier A1 and the second operational amplifier A2 is shown in FIG. 8, which includes signal input ends IN+ and IN−, an output end Vout, and a PMOS bias voltage input end Vbp.

Figure 9:
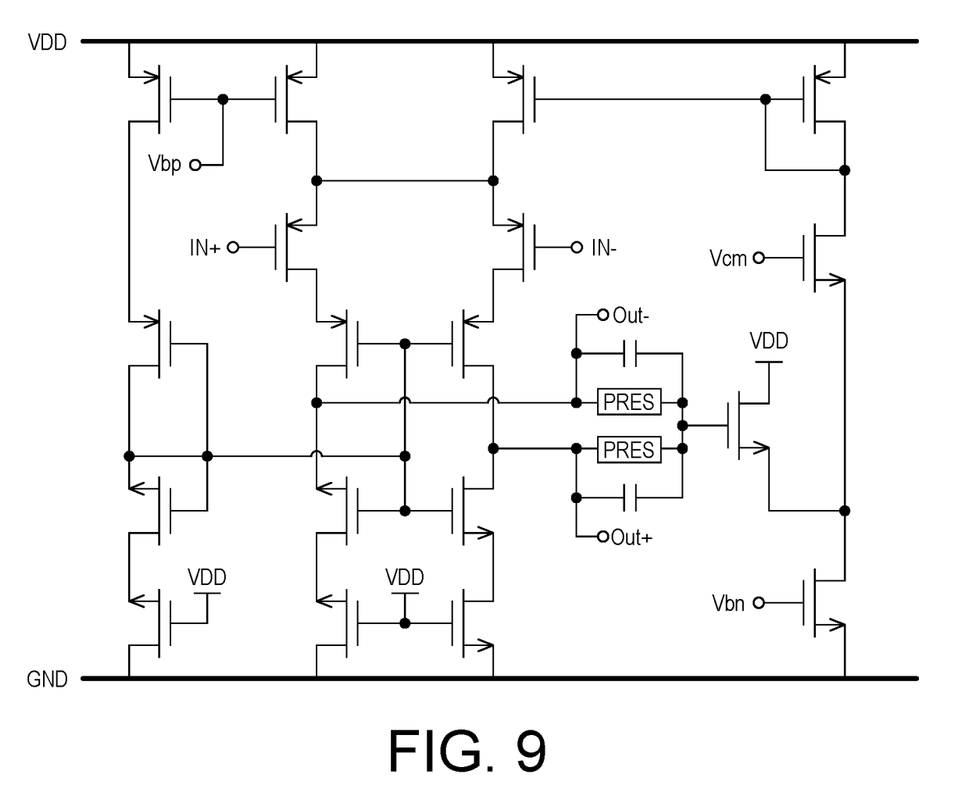
FIG. 9 is a circuit principle diagram of an operational amplifier of a second-level amplifying circuit in the disclosure.

The second-level amplifying circuit 35 mainly consists of a fully differential operational amplifier. The typical circuit structure is shown in FIG. 9, wherein IN+ and IN− are signal input ends of the operational amplifier, Out+ and Out− are signal output ends of the operational amplifier, and Vcm is a common mode voltage input end.

In the negative feedback unit 37, generally during design, let the capacitance values of the capacitors C6=C7, a magnification Av of the chopper amplifying circuit may be calculated as:

$$Av = \frac{2 \times C8}{C6}$$

Figure 11:
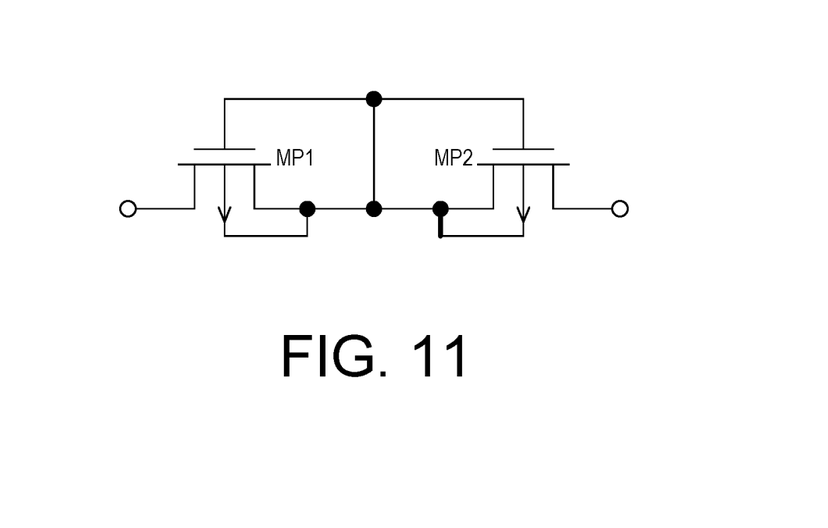
FIG. 11 is a circuit principle diagram of a pseudo resistor PRES in the disclosure.

The typical implementation principle of a pseudo resistor employed in the embodiment is shown in FIG. 11, wherein a drain of a transistor MP1 is one of the interfaces of the pseudo resistor; a drain of a transistor MP2 is other one of the interfaces of the pseudo resistor; a gate of the transistor MP1, a source of the transistor MP1, a substrate of the transistor MP1, a gate of the transistor MP2, a source of the transistor MP2, and a substrate of the transistor MP2 are connected together. From the structural point of view, the circuit structure is symmetrical, and the two interfaces may be interchangeably used in the circuit.

Embodiment 1

Figure 5:
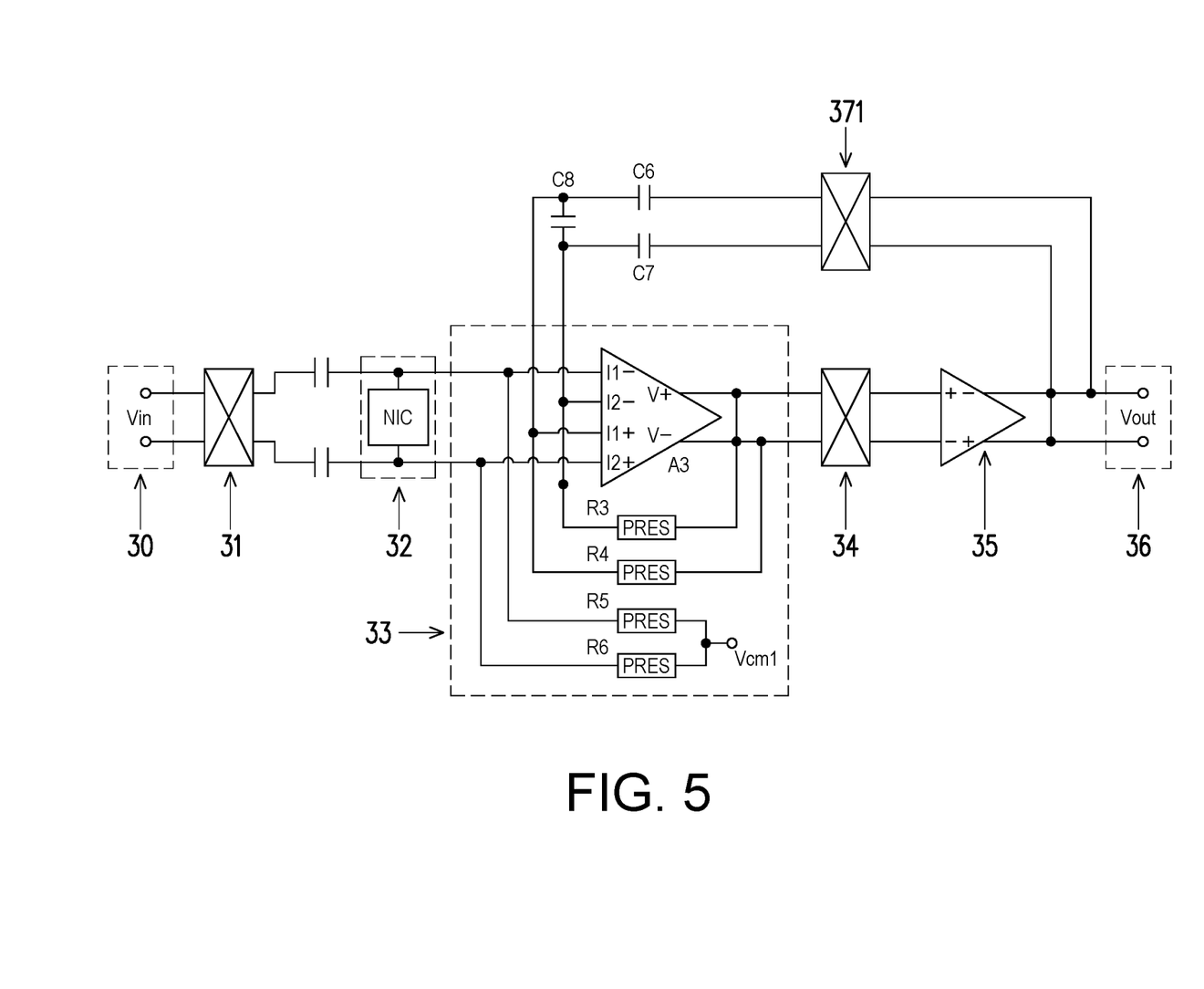
FIG. 5 is a schematic diagram of a circuit structure of Embodiment 1 of the disclosure.

As shown in FIG. 5, a first-level amplifying circuit 33 includes a third operational amplifier A3, a third pseudo resistor R3, a fourth pseudo resistor R4, a fifth pseudo resistor R5, and a sixth pseudo resistor R6. The third operational amplifier A3 includes a corresponding first non-inverting input end and first inverting input end, a corresponding second non-inverting input end and second inverting input end, and also includes a positive output end and a negative output end. One of the output terminals of the first-level chopper switch 31 is connected to the first inverting input end through an input capacitor. Other one of the output terminals is connected to the second non-inverting input end through another input capacitor. The positive output end is connected to the first non-inverting input end after sequentially passing through the second-level chopper switch 34, the second-level amplifying circuit 35, and the negative feedback unit, and is also connected the second inverting input end through the third pseudo resistor R3. The negative output end is connected to the second inverting input end after sequentially passing through the second-level chopper switch 34, the second-level amplifying circuit 35, and the negative feedback unit, and is also connected to the first non-inverting input end through the fourth pseudo resistor R4. After the fifth pseudo resistor R5 and the sixth pseudo resistor R6 are series-connected, two ends are respectively connected to the first inverting input end and the second non-inverting input end, and a common mode voltage input end is connected between the fifth pseudo resistor R5 and the sixth pseudo resistor R6. Two ports of the negative impedance converting circuit 32 are respectively connected to the first inverting input end and the second non-inverting input end.

Figure 7:
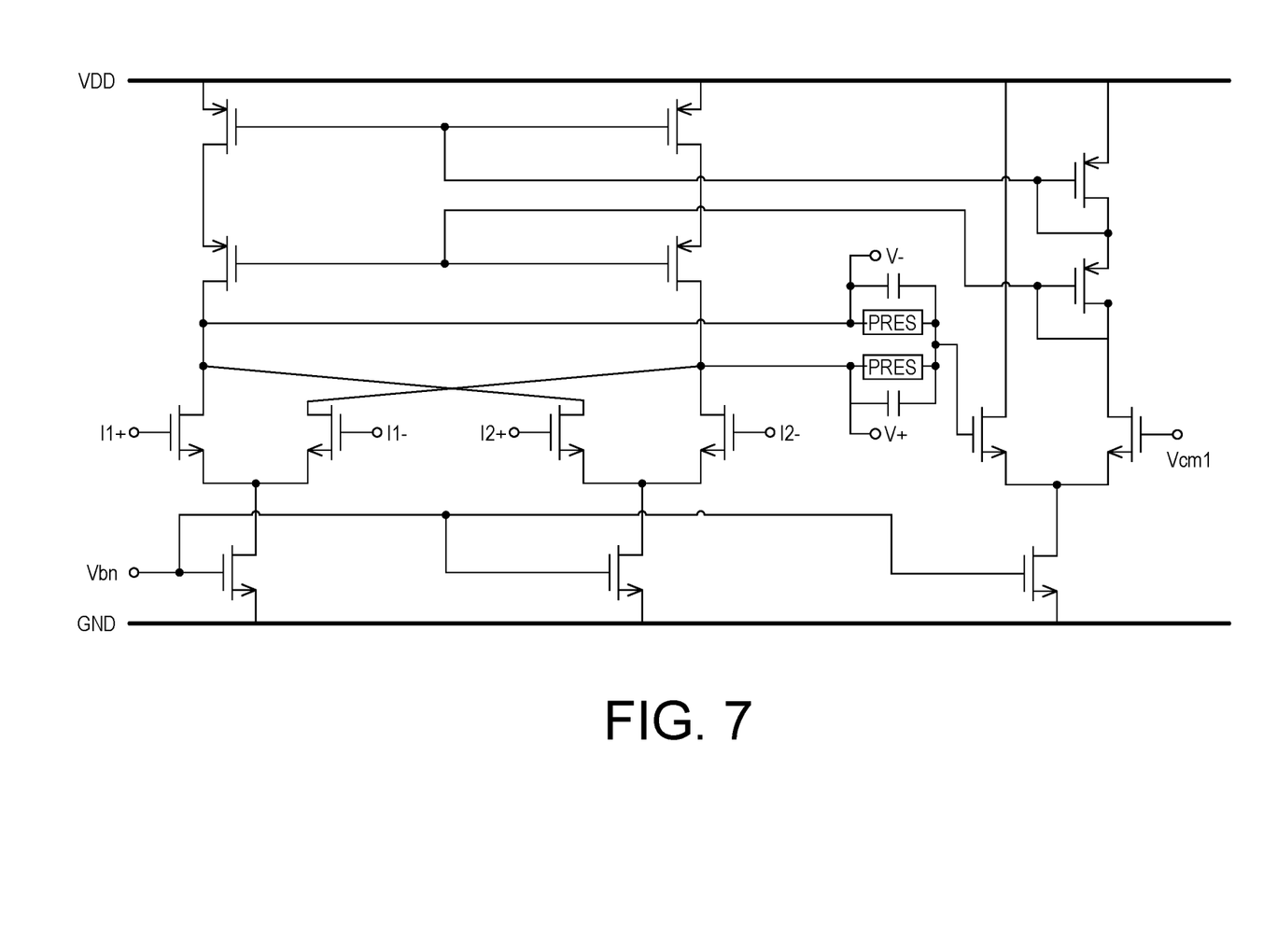
FIG. 7 is a circuit principle diagram of a third operational amplifier A3 in the disclosure.

The third operational amplifier A3 has a double differential input fully differential structure. The typical implementation principle diagram is shown in FIG. 7, which includes two non-inverting input ends IN1+ and IN2+, two inverting input ends IN1− and IN2−, a pair of differential output ends Out+ and Out−, and a common mode voltage input end Vcm1. The third pseudo resistor R3 and the fourth pseudo resistor R4 are input end direct current bias resistors of the third operational amplifier A3. The fifth pseudo resistor R5 and the sixth pseudo resistor R6 are direct current negative feedback resistors of the third operational amplifier A3.

Embodiment 2

Figure 6:
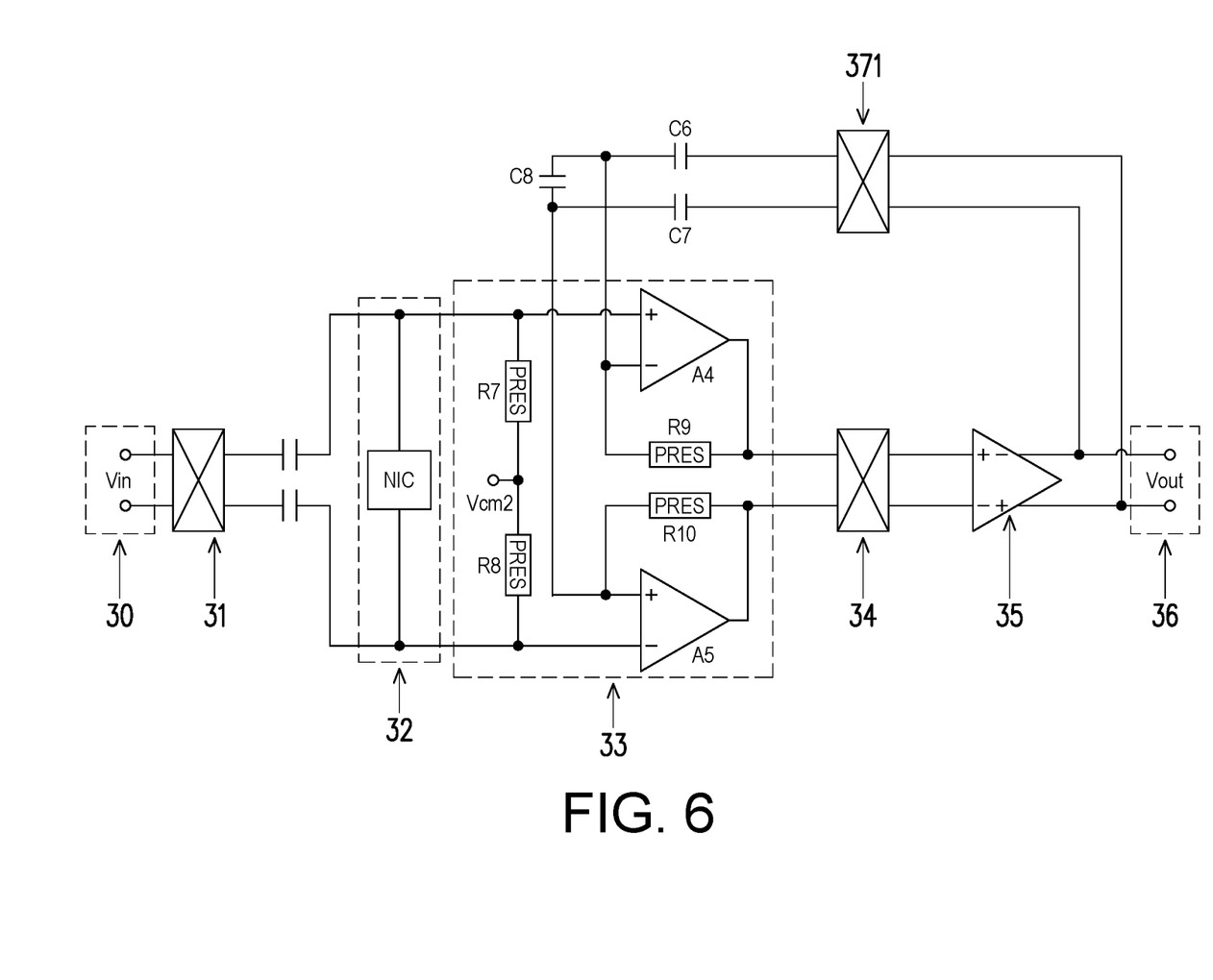
FIG. 6 is a schematic diagram of a circuit structure of Embodiment 2 of the disclosure.

As shown in FIG. 6, a first-level amplifying circuit 33 includes a fourth operational amplifier A4, a fifth operational amplifier A5, a seventh pseudo resistor R7, an eighth pseudo resistor R8, a ninth pseudo resistor R9, and a tenth pseudo resistor R10. A non-inverting input end of the fourth operational amplifier A4 is sequentially series-connected to the seventh pseudo resistor R7 and the eighth pseudo resistor R8, and is then connected to an inverting input end of the fifth operational amplifier A5, and a common mode voltage input end is connected between the seventh pseudo resistor R7 and the eighth pseudo resistor R8. An output end of the fourth operational amplifier A4 is connected to a non-inverting input end of the fifth operational amplifier A5 after sequentially passing through the second-level chopper switch 34, the second-level amplifying circuit 35, and the negative feedback unit, and is also connected to an inverting input end of the fourth operational amplifier A4 through the ninth pseudo resistor R9. An output end of the fifth operational amplifier A5 is connected to the inverting input end of the fourth operational amplifier A4 after sequentially passing through the second-level chopper switch 34, the second-level amplifying circuit 35, and the negative feedback unit, and is also connected to a non-inverting input end of the fifth operational amplifier A5 through the tenth pseudo resistor R10. One of the output terminals of the first-level chopper switch 31 is connected to the non-inverting input end of the fourth operational amplifier A4 through an input capacitor. Other one of the output terminals is connected to the inverting input end of the fifth operational amplifier A5 through another input capacitor. Two ports of the negative impedance converting circuit 32 are respectively connected to the non-inverting input end of the fourth operational amplifier A4 and the inverting input end of the fifth operational amplifier A5.

The fourth operational amplifier A4 and the fifth operational amplifier A5 are both single-ended output differential operational amplifiers. The embodiment has a differential amplification structure composed of two independent operational amplifiers. The typical circuit structure of the operational amplifier is shown in FIG. 8, which includes differential input ends IN+ and IN−, an output end Vout, and a PMOS bias voltage input end Vbp.

For the two different embodiments, the signal output by the first-level chopper switch 31 can be effectively amplified while stabilizing the gain of the chopper amplifying circuit through connecting the feedback signal of the negative feedback unit 37. The specific implementation of the first-level amplifying circuit 33 may be selected according to actual requirements. In addition, the two embodiments illustrate that the method of introducing the negative impedance converting circuit 32 and the circuit structure of the negative impedance converting circuit of the disclosure can be applicable in the chopper amplifying circuit with different circuit structures. As in the two embodiments, the circuit structures of the first-level amplifying circuit 33 are different, but the input impedance may both be improved through the negative impedance converting circuit 32 of the disclosure to implement high input impedance and high stability. It is explained that the negative impedance converting circuit 32 of the disclosure also has a wide range of applicability and can be used in conjunction with various amplifying circuits to achieve high input impedance and high stability.

The chopper amplifying circuit of the disclosure has the advantages of high input impedance, low noise, and full integration. Negative capacitance is implemented through employing the negative impedance converting circuit for compensating the input capacitance of the first-level amplifying circuit, so that the equivalent input capacitance is reduced and the input impedance of the chopper amplifying circuit is greatly improved.

The disclosure solves the issue that the conventional fully differential operational amplifier needs to employ the positive feedback loop to increase the input impedance to construct the chopper amplifier, and has higher stability and more obvious impedance improvement effect.

The disclosure may be widely applied to the field of sensor signal amplification and acquisition, and especially applied to the field of fully integrated design of bioelectric signal acquisition systems such as electroencephalogram and electrocardiogram.

For persons skilled in the art, various other corresponding changes and modifications may be made according to the technical solutions and concepts described above. All the changes and modifications should fall within the protection scope of the claims of the disclosure.

What is claimed is:

1. A chopper amplifying circuit employing a negative impedance compensation technique, comprising: a differential input end, a first-level chopper switch, a negative impedance converting circuit, a first-level amplifying circuit, a second-level chopper switch, a second-level amplifying circuit, a differential output end, a negative feedback unit, and input capacitors, wherein two ports of the differential input end are respectively connected to two input terminals of the first-level chopper switch for inputting a differential voltage signal; two output terminals of the first-level chopper switch are respectively connected to two signal input ends of the first-level amplifying circuit through the input capacitors; two signal output ends of the first-level amplifying circuit are respectively connected to two input terminals of the second-level chopper switch, two output terminals of the second-level chopper switch are respectively connected to two signal input ends of the second-level amplifying circuit, and two signal output ends of the second-level amplifying circuit are respectively connected to two ports of the differential output end, and are also connected to a feedback input end of the first-level amplifying circuit through the negative feedback unit; and the negative impedance converting circuit is parallel-connected to the two signal input ends of the first-level amplifying circuit for reducing an equivalent input capacitance of the first-level amplifying circuit.

2. The chopper amplifying circuit employing the negative impedance compensation technique according to claim 1, wherein the negative impedance converting circuit comprises a first port, a second port, a first capacitor, a second capacitor, a third capacitor, a fourth capacitor, a fifth capacitor, a first operational amplifier, a second operational amplifier, a first pseudo resistor, and a second pseudo resistor; an output end of the first operational amplifier is sequentially series-connected to the second capacitor, the third capacitor, and the fourth capacitor, and is then connected to an output end of the second operational amplifier; a non-inverting input end of the first operational amplifier is connected to the first port, an inverting input end is connected between the second capacitor and the third capacitor, and an output end is connected to the non-inverting input end of the first operational amplifier through the first capacitor; the first pseudo resistor is parallel-connected to two ends of the second capacitor; a non-inverting input end of the second operational amplifier is connected to the second port, an inverting input end is connected between the third capacitor and the fourth capacitor, and an output end is connected to the non-inverting input end of the second operational amplifier through the fifth capacitor; the second pseudo resistor is parallel-connected to two ends of the fourth capacitor; and a capacitance value of the negative impedance converting circuit is set through setting capacitance values of the first capacitor, the second capacitor, the third capacitor, the fourth capacitor, and the fifth capacitor.

3. The chopper amplifying circuit employing the negative impedance compensation technique according to claim 2, wherein the negative feedback unit comprises a negative feedback unit chopper switch, a sixth capacitor, a seventh capacitor, and an eighth capacitor; the two signal output ends of the second-level amplifying circuit are respectively connected to two input terminals of the negative feedback unit chopper switch, one of output terminals of the negative feedback unit chopper switch is connected to the sixth capacitor, other one of the output terminals is connected to the seventh capacitor, and the eighth capacitor is connected to the sixth capacitor and the seventh capacitor.

4. The chopper amplifying circuit employing the negative impedance compensation technique according to claim 3, wherein the first-level amplifying circuit comprises a third operational amplifier, a third pseudo resistor, a fourth pseudo resistor, a fifth pseudo resistor, and a sixth pseudo resistor; the third operational amplifier comprises a corresponding first non-inverting input end and first inverting input end, a corresponding second non-inverting input end and second inverting input end, and also comprises a positive output end and a negative output end; one of the output terminals of the first-level chopper switch is connected to the first inverting input end through one of the input capacitors, other one of the output terminals is connected to the second non-inverting input end through the other one of the input capacitors, and the positive output end is connected to the first non-inverting input end after sequentially passing through the second-level chopper switch, the second-level amplifying circuit, and the negative feedback unit, and is also connected to the second inverting input end through the third pseudo resistor; the negative output end is connected to the second inverting input end after sequentially passing through the second-level chopper switch, the second-level amplifying circuit, and the negative feedback unit, and is also connected to the first non-inverting input end through the fourth pseudo resistor; wherein the fifth pseudo resistor and the sixth pseudo resistor are series-connected, two ends of the series-connected fifth and sixth pseudo resistors are respectively connected to the first inverting input end and the second non-inverting input end, and a common mode voltage input end is connected between the fifth pseudo resistor and the sixth pseudo resistor; and two ports of the negative impedance converting circuit are respectively connected to the first inverting input end and the second non-inverting input end.

5. The chopper amplifying circuit employing the negative impedance compensation technique according to claim 3, wherein the first-level amplifying circuit comprises a fourth operational amplifier, a fifth operational amplifier, a seventh pseudo resistor, an eighth pseudo resistor, a ninth pseudo resistor, and a tenth pseudo resistor; a non-inverting input end of the fourth operational amplifier is sequentially series-connected to the seventh pseudo resistor and the eighth pseudo resistor, and is then connected to an inverting input end of the fifth operational amplifier, a common mode voltage input end is connected between the seventh pseudo resistor and the eighth pseudo resistor, and an output end of the fourth operational amplifier is connected to a non-inverting input end of the fifth operational amplifier after sequentially passing through the second-level chopper switch, the second-level amplifying circuit, and the negative feedback unit, and is also connected to an inverting input end of the fourth operational amplifier through the ninth pseudo resistor; an output end of the fifth operational amplifier is connected to the inverting input end of the fourth operational amplifier after sequentially passing through the second-level chopper switch, the second-level amplifying circuit, and the negative feedback unit, and is also connected to the non-inverting input end of the fifth operational amplifier through the tenth pseudo resistor; one of the output terminals of the first-level chopper switch is connected to the non-inverting input end of the fourth operational amplifier through one of the input capacitors, and other one of the output terminals is connected to the inverting input end of the fifth operational amplifier through other one of the input capacitors; and two ports of the negative impedance converting circuit are respectively connected to the non-inverting input end of the fourth operational amplifier and the inverting input end of the fifth operational amplifier.

* * * * *